United States Patent
Ladebeck et al.

(10) Patent No.: US 7,888,632 B2
(45) Date of Patent: Feb. 15, 2011

(54) CO-REGISTERING ATTENUATION DATA AND EMISSION DATA IN COMBINED MAGNETIC RESONANCE/POSITRON EMISSION TOMOGRAPHY (MR/PET) IMAGING APPARATUS

(75) Inventors: Ralf Ladebeck, Erlangen (DE); Christian J. Michel, Lenoir City, TN (US); Charles C. Watson, Knoxville, TN (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 0 days.

(21) Appl. No.: 12/564,685

(22) Filed: Sep. 22, 2009

(65) Prior Publication Data

US 2010/0074501 A1 Mar. 25, 2010

Related U.S. Application Data

(60) Provisional application No. 61/098,956, filed on Sep. 22, 2008.

(51) Int. Cl.
*G01T 1/161* (2006.01)
(52) U.S. Cl. .............................. 250/252.1; 250/363.09
(58) Field of Classification Search ............... 250/252.1, 250/363.03, 363.04, 370.09; 382/131, 181; 600/427; 703/2
See application file for complete search history.

(56) References Cited

U.S. PATENT DOCUMENTS 7,218,112 B2 5/2007 Ladebeck et al.

| | | | |
|---|---|---|---|
| 2006/0237652 | A1* | 10/2006 | Kimchy et al. ......... 250/363.02 |
| 2008/0088309 | A1 | 4/2008 | Eberler et al. |
| 2009/0105583 | A1* | 4/2009 | Martin et al. ............... 600/422 |

OTHER PUBLICATIONS

Kops et al, "Attenuation correction of PET scanning based on MR images," IEEE Science Symposium and Medical Imaging Conference 2006 (San Diego).

Nuyts et al., "Simultaneous maximum a-psoteriori reconstruction of attenuation and activity distributions from emission sinograms," IEEE Transactions on Medical Imaging, vol. 18, No. 5, pp. 393-403, 1999.

* cited by examiner

*Primary Examiner*—David P Porta
*Assistant Examiner*—Marcus H Taningco
(74) *Attorney, Agent, or Firm*—Peter L. Kendall

(57) ABSTRACT

A method for co-registering attenuation data of MR coils in a MR/PET imaging system with PET emission data includes computing a likelihood of PET emission data on a grid in a parameter space based on an algorithm, wherein the algorithm defines $L(\lambda, \mu body, \mu coils\{p\})$ as a log-likelihood of measured PET data, where $\lambda$ is an emitter distribution (image), $\mu body$ is a known linear attenuation coefficient (LAC) distribution of the body from MRI, $\mu coils$ is a linear attenuation coefficient map of MRI coils, and $\{p\}$ is a set of parameters governing the position of each coil, wherein if $\mu coils$ is assumed, then $\lambda$ can be reconstructed and forward projected and L can be computed. The method includes adjusting the estimated position of the MR coils to maximize the likelihood of emission data based on the computed L.

9 Claims, 2 Drawing Sheets

CO-REGISTERING ATTENUATION DATA AND EMISSION DATA IN COMBINED MAGNETIC RESONANCE/POSITRON EMISSION TOMOGRAPHY (MR/PET) IMAGING APPARATUS

CROSS REFERENCE TO RELATED APPLICATIONS

The present application claims priority to pending U.S. Provisional Patent Application No. 61/098,956 filed Sep. 22, 2008 (the "Provisional"). The Provisional is hereby expressly incorporated by reference into the present application in its entirety.

FIELD OF THE INVENTION

The present invention relates generally to combined modality medical imaging techniques, and in particular to combined Magnetic Resonance/Positron Emission Tomography (MR/PET) imaging. attenuation correction in nuclear imaging. More specifically, it relates to a method for attenuation correction using magnetic resonance (MR) images. Importantly, in the present invention, the attenuation correction using MR images accounts for attenuation due to RF coils in a MR scanner.

BACKGROUND OF THE INVENTION

Positron emission tomography (PET), computed tomography (CT), single photon emission computed tomography (SPECT), and Magnetic Resonance (MR) imaging are commonly used for structural and functional imaging of the human body. These imaging technologies are widely used in medicine and can be used to identify diseases or adverse conditions of organs, tissues and other structures of the body.

In order to obtain accurate images by these methods, it is necessary to perform attenuation correction of the image data. Attenuation correction is derived from an attenuation map, which indicates the three-dimensional regions of space (i.e., "voxels" or volume elements) where photons, X-rays, or other imaging radiation is strongly absorbed. The attenuation maps contain attenuation correction coefficient factors, which are applied to acquired emission data to correct the data for the effects of attenuation at the particular location where the photons are detected.

In a prior nuclear imaging method, an extra CT scan is used to generate the attenuation map necessary for attenuation correction. An extra CT scan is undesirable because it is slow, and because it increases the radiation exposure of the patient. Alternatively, an extra PET scan can be used to generate the attenuation map. However, in this case, the PET scan for attenuation correction provides poor resolution and statistical quality.

A third known method for attenuation correction employs a magnetic resonance imaging (MRI) scan. MRI images have excellent resolution, tissue discrimination, and can be created rapidly and without additional radiation exposure. MRI offers many advantages for attenuation correction. See, for example, Kops, Qin, Mueller-Veggian, and Herzog, "Attenuation correction of PET scanning based on MR images," IEEE Nuclear Science Symposium and Medical Imaging Conference 2006 (San Diego).

In fact, for certain clinical applications it is beneficial to combine MR imaging and PET imaging in one unit to merge the high-resolution anatomical images provided by MR with the functional information provided by PET. A combined MR/PET system is known, for example, from U.S. Pat. No. 7,218,112, assigned to Siemens Aktiengesellschaft and incorporated herein by reference in its entirety. Thus, for a combined MR/PET imaging system, it would seem logical to utilize MR-based attenuation correction to obtain the attenuation map.

However, MR imaging includes local coils to receive radio frequency (RF) signals from the body. These coils can cause inaccuracies in the attenuation correction of the PET image, since the coils would be in the field of view (FOV) of the PET scan, but would not be visible in the MR image used to acquire the attenuation correction factors. This is a significant problem for attenuation correction of emission data from a MR/PET system because accurate determination of attenuation from all objects in the PET FOV, including local MR RF coils, is essential for accurate image reconstruction.

An algorithm has been previously proposed to simultaneously estimate both an emitter concentration distribution and a linear attenuation coefficient distribution from emission data alone by alternating emission and linear attenuation coefficient update steps using an maximum likelihood-expectation maximization (MLEM-like) algorithm. This solution can be under-determined and can converge only to a local maximum of the likelihood. Generally, the method and system cannot be formulated in a way that would allow general constraints to be imposed on the solution and thus generally cannot incorporate the information available on the body coils, or other attenuating objects that may be in the field of view (FOV) during a PET scan of a MR/PET imaging system.

It would be an advance in the art to provide a method for attenuation correction in MR/PET imaging that accounts for the attenuation of PET emission data by RF coils or other objects of the MR scanner in the PET FOV, using PET emission data alone, without any transmission data or MR image data of such coils or objects. Such a method could provide more accurate attenuation correction and improve the quality of the PET images. Also, patient throughput, cost, and safety would be improved.

SUMMARY OF THE INVENTION

The present invention provides a method for improving the accuracy of attenuation data obtained by MR imaging in a MR/PET system. The method includes computing a likelihood on a grid in a parameter space based on an algorithm, wherein the algorithm defines $L(\lambda, \mu_{body}, \mu_{coils}\{p\}$ as a log-likelihood of measured PET data, where $\lambda$ is an emitter distribution (image), $\mu_{body}$ is a known linear attenuation coefficient (LAC) distribution of the body from MRI, $\mu_{coils}$ is a linear attenuation coefficient map of MRI coils, and $\{p\}$ is a set of parameters governing the position of each coil, wherein if $\mu_{coils}$ is assumed, then $\lambda$ can be reconstructed and forward projected and L can be computed. The method then includes adjusting the position and configuration of the MRI coils to maximize the likelihood of emission data based on the computed L.

DETAILED DESCRIPTION OF THE INVENTION

The present invention provides a method for increasing the accuracy of attenuation correction using magnetic resonance imaging techniques in combined MR/PET imaging systems. Critically, the present method can account for attenuation caused by RF coils of a MR scanner in the field of view of the PET scanner during a PET scan. The present method includes, computing a likelihood of emission data on a grid in a parameter space based on an algorithm, wherein the algorithm defines $L(\lambda, \mu_{body}, \mu_{coils}\{p\})$ as a log-likelihood of measured PET data, where $\lambda$ is an emitter distribution (image), $\mu_{body}$ is a known linear attenuation coefficient distribution of the body from MRI, $\mu_{coils}$ is a linear attenuation coefficient map of MRI coils, and $\{p\}$ is a set of parameters governing the position of each coil, wherein if $\mu_{coils}$ is assumed, then $\lambda$ can be reconstructed and forward projected and L can be computed. The method then includes adjusting the position and configuration of the MRI coils to maximize the likelihood of emission data based on the computed L.

Figure 1:
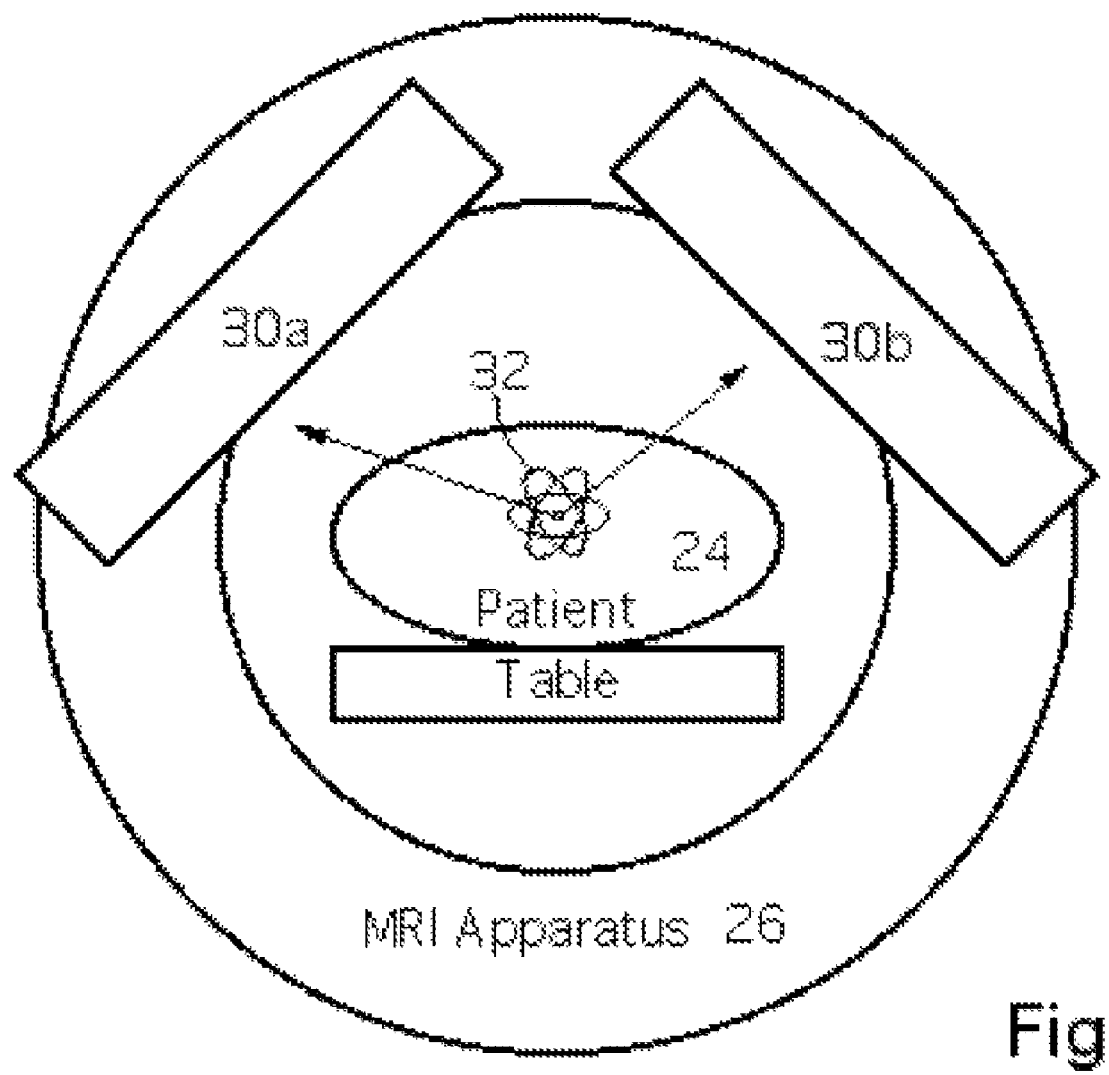
FIG. 1 shows a combined positron emission tomography (PET) and magnetic resonance (MR) imaging scanner that can be used to implement the method according to one embodiment of the present invention.

FIG. 1 shows a medical imaging apparatus capable of performing the method of the present invention. The imaging machine includes a pair of gamma-ray detectors 30a, 30b. The detectors can be scintillation crystals combined with photomultiplier tube photodetectors, or solid-state gamma-ray detectors. When the detectors are used for PET imaging, as is well-known, the detectors are typically positioned 180° apart so as to detect simultaneously emitted 511 keV gamma photons produced by positron annihilation. The gamma rays are emitted by a radiopharmaceutical 32 inside the patient 24. Additionally, the apparatus includes a magnetic resonance imaging (MRI) apparatus 26. The MRI apparatus includes a large magnetic coil for imposing a uniform magnetic field on the patient, and also includes local RF coils for receiving RF signals from the patient's molecules. These RF coils can affect the attenuation of the PET emission data because they typically would be within the field of view of the PET detectors.

MR-based attenuation correction of emission data in MR/PET imaging can be complicated because these local coils used to receive RF signals from a patient's body may not be visible in the MR image that is used to estimate the attenuation correction factors (ACFs) for the PET emission data. Thus, the attenuation of the emission data due to the presence of these coils may not be accounted for. Generally, the shape and structure of these coils is known, or can be measured, prior to a patient scan. A problem can occur in determining the coils' variable position relative to a patent during a clinical scan. The method and system described herein addresses these deficiencies and related problems.

The method and system determines the variable position of local coils used to receive RF signals from a body relative to a patient during a clinical scan by adjusting the position and configuration of the coils to maximize the likelihood of the emission data.

The method and system estimates parameters governing the position and configuration of coils or other objects, whose linear attenuation coefficient (LAC) distributions otherwise can be known, by adjusting these parameters to maximize the likelihood of the PET emission data, assuming a LAC map of a patient derived from the MR image is available. The method and system includes computing likelihood of emission data on a grid in a parameter space. In some examples, sufficient constraints and large coil attenuation can enable determination of useful co-registration information that may be extracted from the emission data.

In particular, the present invention provides a method for improving the accuracy of attenuation data obtained by a MR scan, to take into account the presence of local RF coils in the field of view of the PET scanner in a combined MR/PET system. The method includes computing a likelihood of PET emission data on a grid in a parameter space based on an algorithm, wherein the algorithm defines $L(\lambda, \mu_{body}, \mu_{coils}\{p\})$ as a log-likelihood of measured PET data, where $\lambda$ is an emitter distribution (image), $\mu_{body}$ is a known linear attenuation coefficient (LAC) distribution of the body from MRI, $\mu_{coils}$ is a linear attenuation coefficient map of MRI coils, and $\{p\}$ is a set of parameters governing the position of each coil, wherein if $\mu_{coils}$ is assumed, then $\lambda$ can be reconstructed and forward projected and L can be computed. The method then includes adjusting the position and configuration of the MRI coils to maximize the likelihood of emission data based on the computed L. If a $\mu_{coils}\{p\}$ is assumed, then $\lambda$ can be reconstructed and forward projected, and L can be computed if the position of each coil is known roughly.

One embodiment of the algorithm can include computing test emission images on a grid of points in the parameter space surrounding the approximate location of the coil, and choosing the one whose projection produces the maximum likelihood of emission data. This system and method can be performed with an iterative algorithm. Two dimensional filtered back projections on a coarse matrix can also be utilized. Once an optimal parameter set on the grid is identified, the estimate can be recursively refined by using a finer grid around this point. An alternative embodiment can reconstruct $\lambda$ using the current best estimate of $\{p\}$, and forward project it using attenuation correction factors corresponding to each grid point in parameter space, computing L for each, and updating based on the maximum value. This embodiment can be faster because it involves a single reconstruction, but might converge more slowly. In a further embodiment, depending on how the coil is parameterized, a more sophisticated coordinate ascent algorithm can be employed.

Figure 2:
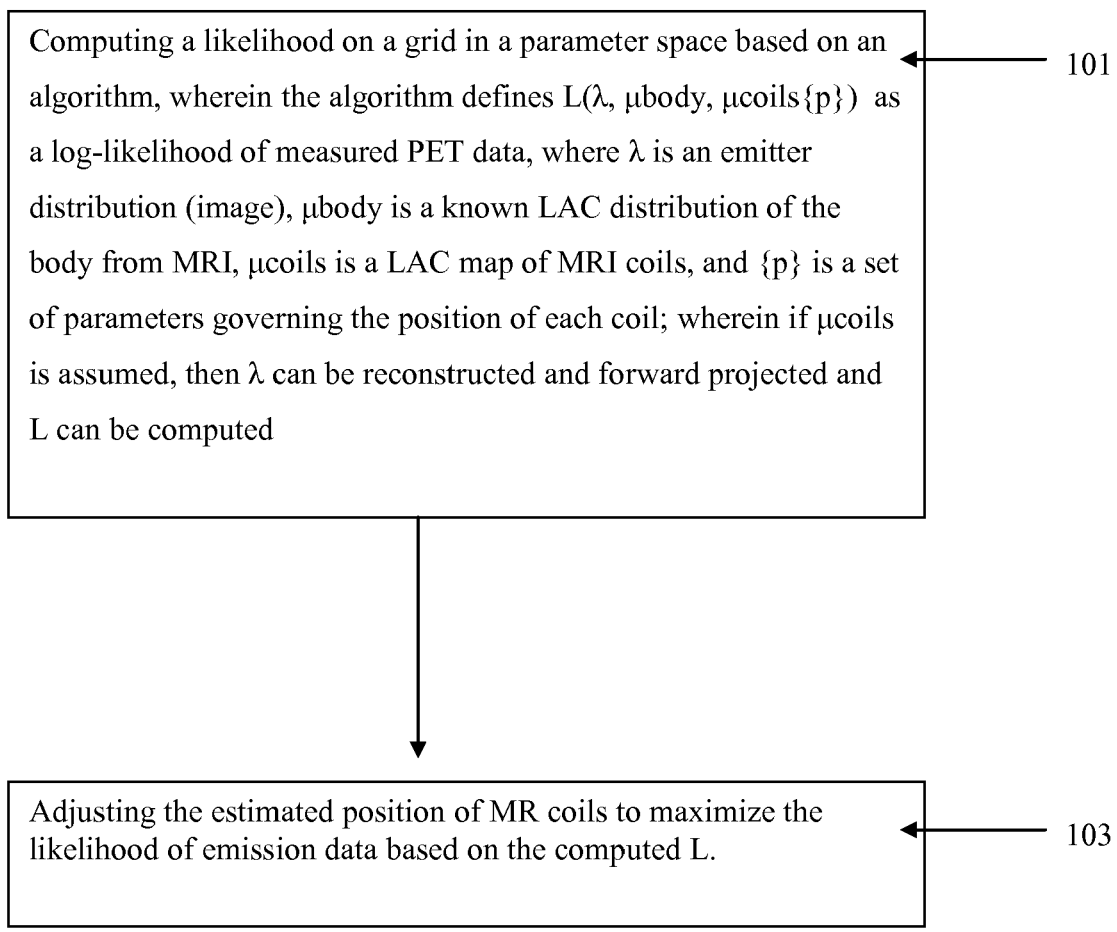
FIG. 2 shows the sequence of steps in a method according to one embodiment of the present invention.

FIG. 2 illustrates the steps in the present method according to one embodiment thereof. These steps are described as follows:

Step 101: First, a likelihood of emission data on a grid in a parameter space based on an algorithm is computed, wherein the algorithm defines $L(\lambda, \mu body, \mu coils\{p\})$ as a log-likelihood of measured PET data, where $\lambda$ is an emitter distribution (image), $\mu$body is a known LAC distribution of the body from MR, $\mu$coils is a LAC map of MR coils, and $\{p\}$ is a set of parameters governing the position of each coil (which may include, for example, position, rotation, shape, etc.), and wherein if $\mu$coils is assumed, then $\lambda$ can be reconstructed and forward projected and L can be computed; and Step 103: Secondly, the estimated position of MR coils is adjusted to maximize the likelihood of emission data based on the computed L.

The method of FIG. 2 can further include computing the likelihood on the grid in the parameter space in an iterative manner. The method can also include computing the likelihood on the grid in the parameter space based on two dimensional filtered back projections on a coarse matrix. The method can also include an example wherein $\{p\}$, the set of parameters governing the position of each coil, includes at least one of position, rotation, and shape data.

The present invention provides an effective method for co-registering an attenuation map of MR coil attenuation data with PET emission data for attenuation correction calculations in MR/PET combined modality systems.

It will be clear to one skilled in the art that the above embodiment may be altered in many ways without departing from the scope of the invention. Accordingly, the scope of the invention should be determined by the following claims and their legal equivalents.

What is claimed is:

1. A method for co-registering attenuation data of MR coils in a MR/PET imaging system with PET emission data, comprising:
   (a) computing a likelihood of PET emission data on a grid in a parameter space based on an algorithm, wherein the algorithm defines $L(\lambda, \mu body, \mu coils\{p\})$ as a log-likelihood of measured PET data, where $\lambda$ is an emitter distribution (image), $\mu body$ is a known linear attenuation coefficient (LAC) distribution of a patient from MR, $\mu coils$ is a LAC map of said MR coils, and $\{p\}$ is a set of parameters governing the position of each coil;
   (b) assuming a $\mu coils\{p\}$;
   (c) reconstructing $\lambda$, and forward projecting $\lambda$ based on an assumed $\mu coils\{p\}$ and computing L based on said reconstruction and forward projection;
   (d) adjusting position parameters of $\{p\}$ assumed in step (b); and
   (e) repeating steps (c) and (d) until the likelihood of emission data based on the computed L is maximized.

2. The method of claim 1, further comprising computing the likelihood on the grid in the parameter space in an iterative manner.

3. The method of claim 1, further comprising computing the likelihood on the grid in the parameter space based on two dimensional filtered back projection on a coarse matrix.

4. The method of claim 1, wherein $\{p\}$ the set of parameters governing the position of each coil includes position, rotation, and shape data.

5. A system for improving for co-registering attenuation data of MR coils in a MR/PET imaging system with PET emission data, comprising:
   a MR/PET scanner, wherein the MR/PET scanner includes RF coils; and
   a processor programmed to (a) compute a likelihood of PET emission data on a grid in a parameter space based on an algorithm, wherein the algorithm defines $L(\lambda,$ $\mu body, \mu coils\{p\})$ as a log-likelihood of measured PET data, where $\lambda$ is an emitter distribution (image), $\mu body$ is a known linear attenuation coefficient (LAC) distribution of a patient from MR, $\mu coils$ is a LAC map of said MR coils, and $\{p\}$ is a set of parameters governing the position of each coil; (b) assume a $\mu coils\{p\}$; (c) reconstruct $\lambda$, and forward project $\lambda$ based on an assumed $\mu coils\{p\}$, and compute L based on said reconstruction and forward projection; (d) adjust position parameters of $\{p\}$ assumed in step (b); and (e) repeat steps (c) and (d) until the likelihood of emission data based on the computed L is maximized.

6. The system of claim 5, wherein said processor is further programmed to compute the likelihood on the grid in the parameter space in an iterative manner.

7. The system of claim 5, wherein said processor is further programmed to compute the likelihood on the grid in the parameter space based on two dimensional filtered back projection on a coarse matrix.

8. The system of claim 6, wherein $\{p\}$ the set of parameters governing the position of each coil includes position, rotation, and shape data.

9. A computer-readable storage medium, having stored thereon computer-executable instructions for co-registering attenuation data of MR coils in a MR/PET imaging system with PET emission data, said computer-executable instructions comprising:
   (a) computing a likelihood of PET emission data on a grid in a parameter space based on an algorithm, wherein the algorithm defines $L(\lambda, \mu body, \mu coils\{p\})$ as a log-likelihood of measured PET data, where $\lambda$ is an emitter distribution (image), $\mu body$ is a known linear attenuation coefficient (LAC) distribution of a patient from MR, $\mu coils$ is a LAC map of said MR coils, and $\{p\}$ is a set of parameters governing the position of each coil;
   (b) assuming a $\mu coils \{p\}$;
   (c) reconstructing $\lambda$, and forward projecting $\lambda$ based on an assumed $\mu coils\{p\}$ and computing L based on said reconstruction and forward projection;
   (d) adjusting position parameters of $\{p\}$ assumed in step (b); and
   (e) repeating steps (c) and (d) until the likelihood of emission data based on the computed L is maximized.

* * * * *